United States Patent [19]
Inoue et al.

[11] Patent Number: 5,270,493
[45] Date of Patent: Dec. 14, 1993

[54] PRINTED CIRCUIT BOARD HAVING ELECTROMAGNETIC WAVE SHIELD LAYER AND SELF-CONTAINED PRINTED RESISTOR

[75] Inventors: Kazuhiko Inoue, Yokohama; Yoichi Haruta, Kuwana; Motohito Yamanaka, Aichi; Yuji Kawada, Ichikawa, all of Japan

[73] Assignees: Matsushita Electric Industrial Co., Ltd., Osaka; Toagosei Chemical Industry Co., Ltd., Tokyo, both of Japan

[21] Appl. No.: 789,972

[22] Filed: Nov. 12, 1991

[30] Foreign Application Priority Data

Nov. 26, 1990 [JP] Japan .................. 2-322140

[51] Int. Cl.$^5$ ............................ H05K 1/00
[52] U.S. Cl. ....................... 174/253; 174/35 R
[58] Field of Search .............. 174/35 R, 250, 254, 174/255, 256, 260, 262; 361/397, 403, 321; 357/51

[56] References Cited

U.S. PATENT DOCUMENTS

| | | | |
|---|---|---|---|
| 3,366,519 | 1/1968 | Pritchard, Jr. et al. | 174/250 |
| 4,801,489 | 1/1989 | Nakagawa et al. | 174/35 R X |
| 4,821,007 | 4/1989 | Fields et al. | 174/262 X |
| 4,945,323 | 7/1990 | Gerstenberg et al. | 174/262 X |
| 4,973,799 | 11/1990 | Soma et al. | 174/260 |
| 5,025,116 | 6/1991 | Kawakami et al. | 174/35 R X |
| 5,030,800 | 7/1991 | Kawakami et al. | 174/35 R X |
| 5,032,694 | 7/1991 | Ishihara et al. | 174/256 |

FOREIGN PATENT DOCUMENTS

1-295482 11/1989 Japan .

*Primary Examiner*—Leo P. Picard
*Assistant Examiner*—Trinidad Korka
*Attorney, Agent, or Firm*—Stevens, Davis, Miller & Mosher

[57] ABSTRACT

A multi-layer printed circuit board with self-contained printed resistors includes an undercoat layer made of an insulating material and formed on an outermost conductor circuit at least except for a ground portion of the outermost conductor circuit; an electro-magnetic wave shield layer made of a cured copper paste and formed on the undercoat layer and the ground portion of the outermost conductor circuit so as to cover a generally entire surface of the outermost conductor circuit; and protective overcoat covering an outer surface of the shield layer.

3 Claims, 3 Drawing Sheets

PRINTED CIRCUIT BOARD HAVING ELECTROMAGNETIC WAVE SHIELD LAYER AND SELF-CONTAINED PRINTED RESISTOR

BACKGROUND OF THE INVENTION

This invention relates generally to a printed circuit board having self-contained printed resistors, and more particularly to a printed circuit board with self-contained printed resistors which is capable of reducing the influence by noises.

Because of a small-size design and a multi-function design of electronic devices, printed circuit boards have now been directed toward a higher density design. Such a high-density packaging is made, for example, by the narrowing of the pattern of a conductor circuit, a multi-layer construction, the reduction of a diameter of through holes including an interstitial via hole, such as a blind hole and a barried hole, and the mounting of small-size chips on the surface of the board.

As one of such high-density packaging (mounting) techniques, there has been developed a printed resistor. For forming such a printed resistor, a paste for a polymer thick-film resistor is applied, for example, by screen printing to a surface of an insulating board so as to extend between terminals of conductor circuits formed in a predetermined pattern on the insulating board, and then this paste is thermoset to provide the printed resistor. This printed resistor is useful for a high-density arrangement of electronic parts where it is difficult to mount separate resistors on the insulating board, and therefore the printed resistor is advantageous for a high-density packaging. And besides, since the printed resistor is very thin as a resistor, it can advantageously be formed beneath other parts, and can be arranged to intersect jumper wires for the conductor paste in a three-dimensional manner via an insulating coat layer. Further, the printed resistor can be formed by screen printing enabling mass-production, and therefore the printed resistors have been widely used in a single-sided circuit board, a double-sided circuit board and a hybrid circuit board for livelihood devices, such as a radio and a recorder.

Because of the above high-density arrangement of the pattern of the printed circuit board and the above high-density mounting of the parts and also because of an increased application of information equipment for livelihood use, multi-layer printed circuit boards have been increasingly used also in livelihood devices. From now on, it is thought that the high-density design, achieved by the narrowing of the pattern of the circuit conductor, the reduction of the diameter of the through holes, and the mounting of small-size chips on the board surface (particularly, a direct mounting technique), will make further progress in this field.

With respect to the technique of mounting the chips on the surface among these techniques, fine chips are connected directly to the circuit pattern on the printed circuit board without the use of leads, so that the number of parts to be mounted on a given area can be increased, and also the parts can be mounted on both of the front and reverse surfaces of the printed board, thereby enhancing the mounting density.

However, it is not always advisable that the above technique useful for the high-density design be applied to a multi-layer printed circuit board for reasons given below. Namely, the area of the circuit board can be reduced by the multi-layer structure, but the chips can be mounted only on the two outermost layers (i.e., the opposite sides) of the circuit board, and therefore in many cases the minimum area required for the circuit board is limited by the number of the chips to be mounted. With respect to this problem, although the number of the chips to be mounted can be reduced by forming separate circuits into an integrated circuit (IC), this IC formation requires the accumulation of technology, and also can be practiced only for the purpose of mass-production. Thus, the IC formation is not easy, and poses a problem that the cost is increased.

Generally, the number of resistors used in a livelihood circuit board is about ⅓ to ¼ of all the parts. Therefore, if the resistors among the chips to be mounted are formed into the above-mentioned thin-film printed resistors, and are combined with other printed wiring board so as to be contained in a multi-layer printed circuit board, the above problem can be considerably solved. This is true not only with the resistors among the chips to be mounted on the board, but also with discrete resistors which are connected to the conductor circuit by their lead wires passed through parts holes in the printed board.

One example of the prior art proposed based on this idea is a multi-layer printed circuit board in which an inner-layer board, having printed resistors formed by a paste for a polymer thick-film resistor, is combined with prepregs and wiring boards to provide a laminate construction which is integrated under heat and pressure to provide the multi-layer printed circuit board (Japanese Patent Unexamined Publication No. 60-263499). It has also been proposed that when forming this multi-layer structure, the surface of the printed resistor mounted on the inner-layer board is coated with a protective coat composed of a cured (set) resin paste, so that at the time of the lamination, adverse effects of the prepreg sheet (which is disposed above the printed resistor) on the printed resistor can be suppressed (Japanese Patent Unexamined Publication No. 52-140866).

When the multi-layer printed circuit board is to be produced with the inner-layer board (which has the printed resistors mounted thereon) incorporated therein, the resistivity of the printed resistor in the resultant multi-layer printed circuit board may deviate greatly from a target value, because the resin constituting the printed resistor is softened during the step of applying the heat and pressure. To avoid this, there has been proposed a printed circuit board with self-contained resistors in which a paste for a polymer thick-film resistor, which is composed mainly of a thermosetting resin polymerizable upon reaction of a methylol group, a thermosetting resin polymerizable upon ring-opening reaction of an oxirane ring, or a mixture of these two resins, is applied between terminals of conductor circuits formed on a board so as to provide a polymer thick-film resistor bridging between these terminals, and then a protective film is coated onto the surface of this resistor, and then this board is integrally combined with prepreg sheets (Japanese Patent Unexamined Publication No. 1-295482).

With the high-density packaging (mounting) and high-speed operation of electronic devices, there has also arisen a new problem that one electronic device causes jamming (radio trouble) on another electronic device, and this problem has become a familiar one. The jamming is regulated or restrained under various international rules, and in Japan, also, the regulations against radiation noises have been made under the self-imposed control advocated by Jamming Self-imposed Control Institute for Information Processing Systems or the like (VCCI), and it is expected that this control will be strengthened from now on.

Further, with the high-density and high-speed design, the spacing (distance) between parts, as well as the spacing between the conductors on the printed circuit board, has been getting smaller and smaller, and as a result a static coupling is promoted, which causes a problem that a noise trouble is liable to occur in the electronic device.

Various such problems of jamming and noise trouble have heretofore been dealt with by a suitable selection of electronic circuits and electronic parts, the use of a noise filter, the shielding, the grounding, the wiring, and so on. However, it has been difficult to meet with the above regulation.

Therefore, in order to overcome these problems, there has been developed an electromagnetic wave shield printed circuit board in which an insulating layer (interlayer insulating layer), as well as a shield layer of a copper paste (which is screen-printed) are formed on the surface of a conventional printed circuit board, and then an overcoat is formed (Hanyu et al., National Technical Report, Vol. 35, No. 4, page 76 to 82, 1989).

Due to the following effects, this electro-magnetic wave shield printed circuit board prevents jamming and noise troubles:

(1) When shield layers are to be provided on a multi-layer printed circuit board, shield layers of a copper foil are usually formed respectively on upper and lower surfaces of an inner conductor circuit. With these shield layers, the conventional shield effect is obtained.

(2) A bypass capacitor is additionally provided between the shield layer of a copper paste, connected to a ground circuit, and signal circuits (the conductor circuits on the surface), and therefore the energy, which would reside on the signal circuits on the surface as in the conventional printed board, flows to the ground via this bypass capacitor. Thus, the effect by the capacitor is obtained.

(3) The shield layer forms the ground at a uniform distance relative to each signal circuit, and the shield layer is connected to the ground circuit in a multi-contact manner, and also covers a generally entire area of the signal circuits. Therefore, the ground circuit can be rendered into a low-inductance nature, so that high-frequency components of the energy hardly reside on the ground circuit, thereby hardly causing an unnecessary radiation of the electromagnetic wave. Thus, a ground reinforcing effect is obtained.

As described above, although the conventional printed circuit board with the self-contained printed resistors can achieve the high-density packaging to provide a thin and small-size construction, the electromagnetic wave shield effect is insufficient. Further, the electromagnetic wave shield printed circuit board does not have a sufficient space for mounting the parts (particularly, the chips) on its surface, and therefore it has a disadvantage that the enhancement of the packaging density is limited.

SUMMARY OF THE INVENTION

The inventors of the present invention have made an extensive study and effort in an attempt to provide a printed circuit board which enables a higher-density design of electronic devices which have now been getting high in density and speed, and provides an excellent electromagnetic wave shield effect. As a result, the present inventors have found an unexpected advantage that when an electromagnetic wave shield layer is formed on an outermost conductor circuit of a multi-layer printed circuit board having self-contained printed resistors, the shield effect can be enhanced not only by the shield effect of this shield layer but also by the synergistic effect achieved by the shield layer and the self-contained printed resistors. Based on these findings, the present invention has been completed.

More specifically, according to the present invention, there is provided a multi-layer printed circuit board with self-contained printed resistors, comprising:

an undercoat layer made of an insulating material and formed on an outermost conductor circuit at least except for a ground portion of the outermost conductor circuit;

an electromagnetic wave shield layer made of a cured copper paste and formed on the undercoat layer and the ground portion; and a protective overcoat covering an outer surface of the shield layer.

According to another form of the invention, in this multi-layer printed circuit board, there can be provided another electromagnetic wave shield layer surrounding the printed resistors in a common plane.

In the multi-layer printed circuit board of the present invention, the high-density packaging can be achieved by the provision of the self-contained printed resistors, and the influence of external electro-magnetic waves on the resistors, as well as unnecessary radiation of electromagnetic waves, can be greatly reduced by the shield effect of the outer cured copper paste formed to cover the semiconductor circuit directly or through the undercoat layer and by the synergistic effect achieved by this cured copper paste and the self-contained resistors.

In another form of the invention mentioned above, in which another electromagnetic wave shield layer is so provided as to surround the printed resistors in a common plane, a shield effect (which has not hereto-fore been obtained) by this electromagnetic wave shield layer is added, and the influence of external electromagnetic waves on the resistors, as well as unnecessary radiation of electromagnetic waves, can be further reduced greatly.

DESCRIPTION OF THE PREFERRED EMBODIMENT

A multi-layer printed circuit board according to the present invention will now be described in detail with reference to the drawings.

Figure 1:
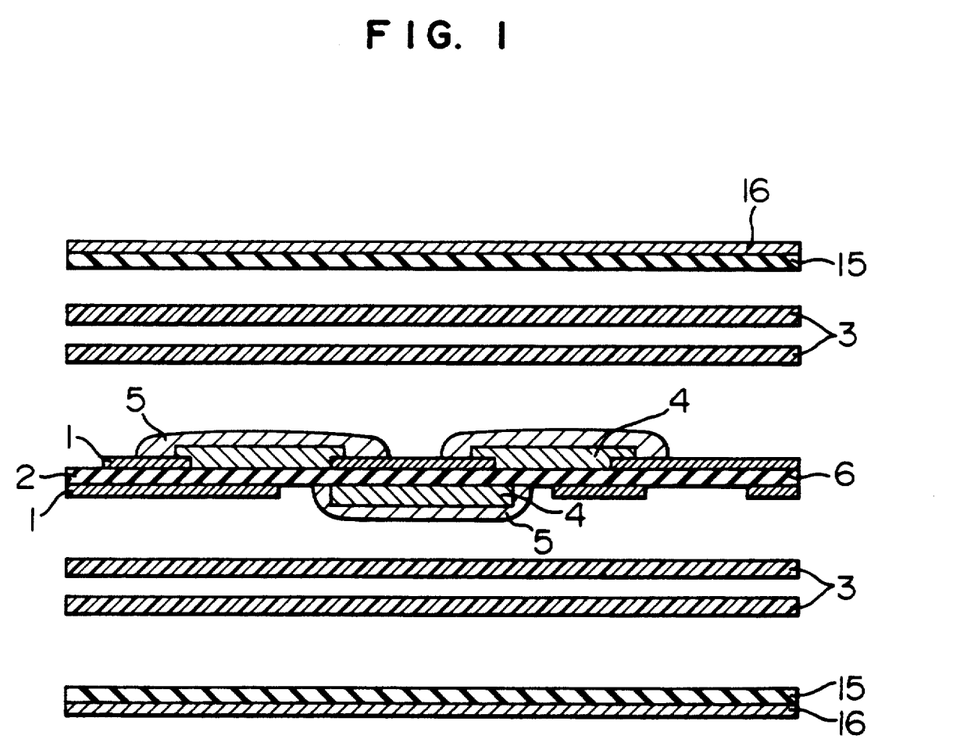
FIG. 1 is a schematic cross-sectional view given for explaining a process of the production of a multi-layer printed circuit board according to the present invention, as well as the construction of this printed circuit board.
Figure 2:
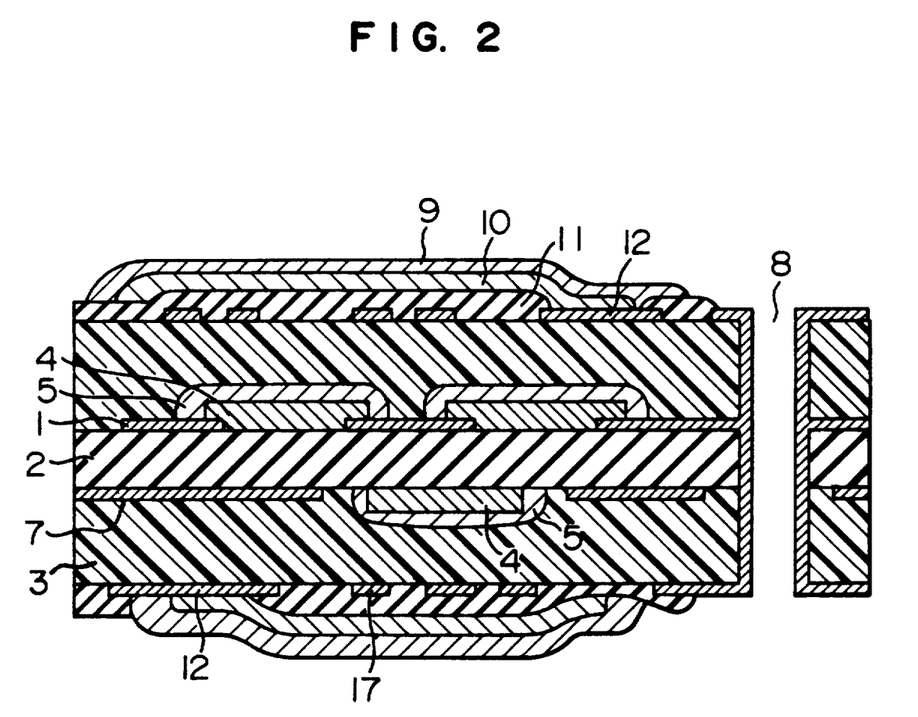
FIG. 2 is a schematic cross-sectional view of one example of multi-layer printed circuit board according to the present invention.
Figure 3:
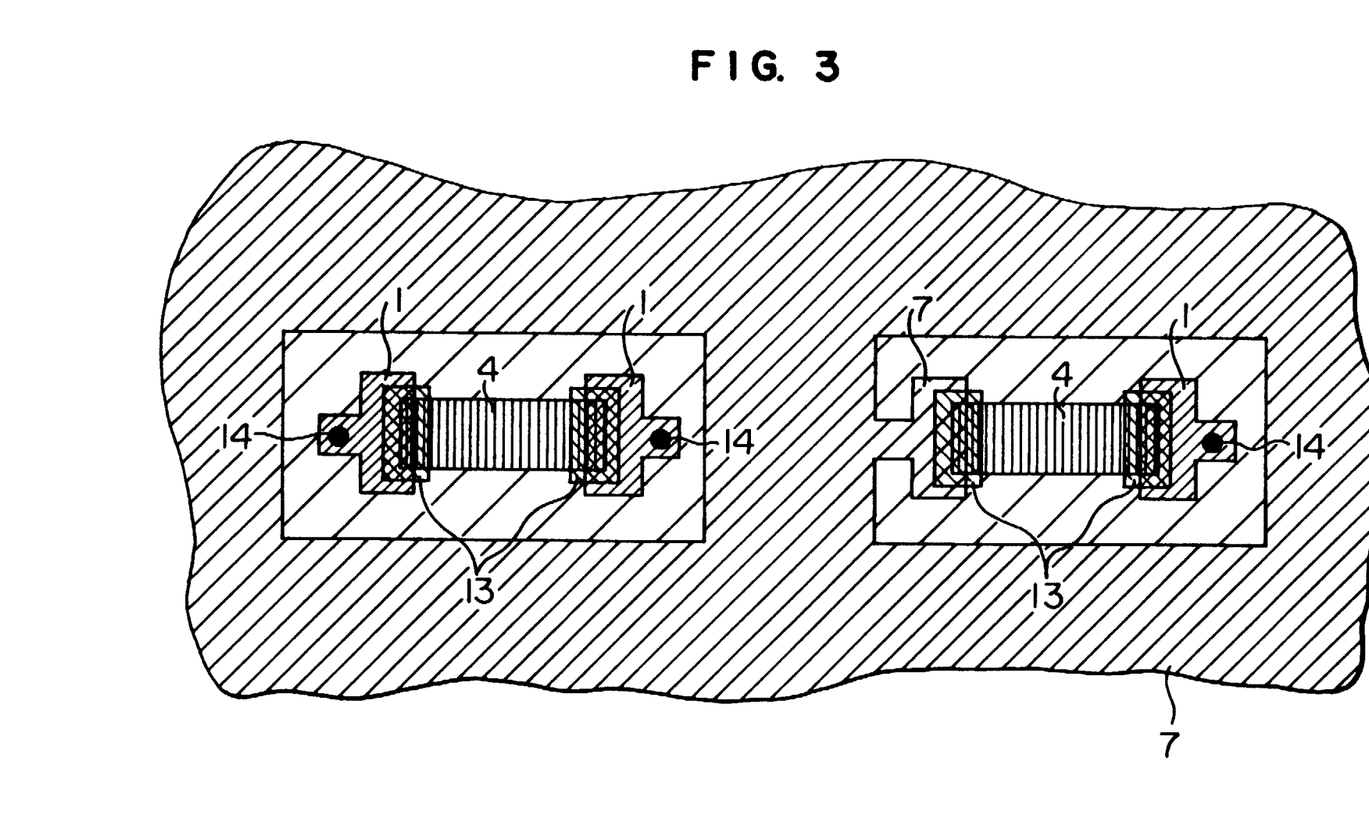
FIG. 3 is a plan view of a portion of an inner-layer printed circuit board, showing the arrangement of printed resistors contained in the multi-layer printed circuit board according to the present invention.

FIG. 1 is a schematic cross-sectional view given for explaining a process of the production of the multi-layer printed circuit board of the present invention, as well as the construction of this printed circuit board. FIG. 2 is a schematic cross-sectional view of one example of multi-layer printed circuit board according to the present invention. FIG. 3 is a plan view of a portion of an inner-layer printed circuit board, showing the arrangement of printed resistors contained in the multi-layer printed circuit board according to the present invention.

In FIG. 1, conductor circuits 1 made by forming a copper foil into a predetermined pattern are provided on one or each side of an insulating board 2. Resistors 4 are formed by printing on the insulating board 2 so as to extend between terminals of some of these conductor circuits. An overcoat 5 is provided to cover and protect each resistor 4. Then, prepregs 3 and an insulating board 15 having a copper foil 16 are superposed on each of both sides (surfaces) of a single-sided or a double-sided printed circuit board 6 which comprises the insulating board 2 having the resistors 4 mounted thereon, and are laminated under heat and pressure to provide a copper-clad laminate board containing the resistors 4. In this case, the insulating boards 15 each having the copper foil 16 may be replaced by printed circuit boards each having already-formed conductor circuits.

The conductor circuits and the resistors to be provided in the interior of the copper-clad laminate board may be laminated in many layers through insulating layers.

As shown in FIG. 2, then, holes are formed in the laminate board according to the need, and a plating pattern formation is carried out, thereby providing a multi-layer printed circuit board having at each outermost layer thereof a conductor circuit 17 formed by patterning the copper foil 16.

Then, an electrically-insulating undercoat 11 is formed on each side of the multi-layer printed circuit board at least except for a ground portion 12 of the second conductor circuit 17 and except for a portion in which the undercoat becomes a hindrance if it is formed therein, that is, a part of land portion of the conductor circuits such as, for example, a through-hole land portion in which a lead portion is inserted and soldered, a land portion adapted to mount chip parts and to be soldered, a connector terminal portion, a terminal portion for electric inspection and etc., and then a copper paste is coated onto both the undercoat and the ground portion and, if occasion demands, onto the land portion so that generally the entire surface of the conductor circuit is covered by it directly or through the undercoat layer, and is set or cured to provide an electromagnetic wave shield layer 10. Then, a protective overcoat 9 is formed on the shield layer 10, thereby obtaining a printed circuit board of the present invention which has the self-contained printed resistors and the electromagnetic wave shield layers.

Generally, the printed resistor is constituted by the terminals of the conductor circuits formed on the surface of the insulating board, the polymer thick film resistor bridging between these terminals, and the protective coat formed on the surface of the polymer thick-film resistor.

The insulating board for mounting the printed resistors thereon may be of any type so long as it is an insulating board of a setting resin, reinforced by fibers and/or fabric, which is used usually as an insulating board for a printed circuit board.

Examples of the above reinforcing material include a non-woven fabric of paper, a non-woven fabric of glass fibers, a non-woven fabric of aramid fibers, a non-woven paper/aramid fiber fabric, a woven fabric of glass fibers, a woven fabric of aramid fibers, and a woven or a non-woven fabric of carbon fibers. The resin component for the matrix is, for example, a thermosetting resin such as a phenolic resin, an epoxy resin, an unsaturated polyester resin and a polyimide resin.

The conductor circuits of a predetermined pattern are formed on the surface of this insulating board. The polymer thick-film resistors (later described) are provided to bridge between the terminals of these conductor circuits. Therefore, in order to maintain a good ohmic contact between the terminal and the polymer resistor, the terminal is formed, for example, by printing a paste formed by dispersing a predetermined amount of metal powder (e.g. silver) in a viscous resin, or is formed by a copper foil plated with gold. The terminals of the conductor circuits are interconnected (bridged together) by the polymer thick-film resistor. This thick-film resistor is constituted by a set (cured) paste (1) comprising a resin (later described) as a main component.

The thick-film resistor can be formed in the following manner. Namely, first, the paste (1) is printed so as to extend between the terminals of the conductor circuits.

In this case, this printing can be performed by any conventional printing method, and is not particularly limited to a specific printing method. For example, a screen printing process, a gravure printing process, an offset printing process, and a description process using a dispenser can be used. Among these processes, the screen printing process and the description process by the dispenser are preferred.

The paste (1) is prepared by blending a resin serving as a binder, a solvent, an electrically-conductive filler, and optionally a non-electrically conductive filler in a predetermined ratio.

The resin used for preparing the paste (1) is, for example, a thermosetting resin (hereinafter referred to as "resin A") polymerizable upon reaction of its own methylol group (—CH$_2$OH) to be converted into a non-fusible set substance, a thermosetting resin (hereinafter referred to as "resin B") polymerizable upon a ring opening reaction of an oxirane ring to be converted into a non-fusible set substance, or a mixture of the these two resins. In this case, the resistor whose characteristics are subjected to less deterioration can be obtained, and this is desirable.

The resin A is composed of an aromatic ring compound and/or an aromaticity ring compound having at least one methylol group in a molecule. Examples thereof include a phenol-formaldehyde resin, a urea-formaldehyde resin, a melamine-formaldehyde resin, a phenol modified xylene-formaldehyde resin, a phenol-furfural resin, a furfural-acetone resin, a ketone-formaldehyde resin, a benzoguanamine-formaldehyde resin, and an aniline-formaldehyde resin. Among these resins, the phenol-type resins are preferred because of their ability of intimate bonding to the insulating board.

The resin B is composed of a compound which is rendered to have a glycidyl group by the reaction between various compounds and epihalohydrin or by oxidation of a double bond. Examples thereof include a glycidyl ether-type epoxy resin, such as a bisphenol type, a phenolic novolak type and a cresol novolak type, an alicyclic epoxy resin, and a glycidyl ester-type epoxy resin such as a fatty ester type and an aromatic carboxylic acid ester type. Among them, the glycidyl ether-type epoxy resin, such as a bisphenol type, a phenolic novolak type and a cresol novolak type, is preferred because of the ability of intimating bonding to the insulating board.

Also, a mixture of the above resins A and B prepared by mixing the two in a predetermined ratio can be used. If necessary, in addition to the above resin A and resin B, a small amount of a thermoplastic resin may be added.

Both the resin A and the resin B are a thermosetting resin, and therefore during the heating step, a condensation reaction through the methylol group proceeds in the case of the resin A, and the polymerization reaction due to the ring opening reaction of the oxirane ring proceeds in the case of the resin B. As a result, these resins are changed into the set substance of a three-dimensional net structure as a whole.

During this thermosetting process, these resins bind the electrically-conductive filler and the nonelectrically conductive filler to form the polymer thick film resistor. At this time, the above fillers are dispersed uniformly in the resistor, and therefore its resistivity is subjected to less variation even in a heat and/or moisture atmosphere, and hence has a stable value, and besides the reproducibility is excellent.

Further, these resins have a good affinity for other thermosetting resin used for the insulating board, such as a maleimide resin, an unsaturated polyester resin, an epoxy resin and a phenolic resin, and therefore when the resin forming the resistor is laminated to the insulating board of such a resin, a good bonding therebetween can be obtained. As a result even when the laminated board is subjected to working, such as drilling, cutting and stamping, a thermal temperature cycle, and a highly-humid atmosphere, an interlayer separation will hardly occur.

In the multi-layer printed circuit board having the self-contained printed resistors, when the electromagnetic wave shield layer is to be formed on the outermost conductor circuit, the insulating layer is formed on the this conductor circuit pattern, and then the electromagnetic wave shield layer made of a cured copper paste is formed on this insulating layer, and then the protective overcoat is formed on this shield layer by a solder resist or the like.

As a material of the insulating layer used in the invention, there may be used any one of a dry film resist composed of photosensitive film; a solder resist which is liquid resist of thermosetting type or ultraviolet-setting type and which is used as permanent resist; a coverlay for flexible printed circuit board which coverlay is formed by coating an adhesive onto an insulating film of a kind selected from the group consisting of polyimide, polyester and polyamide; an insulating paste of thermosetting type such as epoxy resin and melamine resin; and ultraviolet-cured resin paste modified by acrylic acid, metacrylic acid and cinnamic acid etc. As a product on the market for the insulating layer, there are SSR-671 produced by Sanei Chemical Co. Ltd.; SR-60, CR-10, and CR-20 produced by Asahi Kaken Co. Ltd.; S-222 produced by Taiyo Ink Co. Ltd.; and C-740, C-830, and C-850 produced by Shikoku Kasei Co. Ltd.

The copper paste used in the invention is a mixture of copper powder and a binder composed of a main constituent of a thermosetting resin or an electron ray-cured resin, a product on the market of this copper paste being NF-2000 produced by Tatsuta Densen Co. Ltd.; E-1000 and S-5000 produced by Mitsui Metal Kogyo Co. Ltd.; ACP-007P produced by Asahi Kensei Co. Ltd.; and DTS-300 produced by Toagosei Chemical Co. Ltd.

As the material of the overcoat, similarly to the case of the insulating layer, there may be used any one of dry film resist composed of photosensitive film; solder resist which is a liquid resist of thermosetting type or ultraviolet-setting type and which is used as a permanent resist; a coverlay for flexible printed circuit board which coverlay is formed by coating an adhesive onto an insulating film of a kind selected from the group consisting of polyimide, polyester and polyamide; an insulating paste of thermosetting type such as epoxy resin and melamine resin; and a ultraviolet cured resin paste modified by acrylic acid, metacrylic acid and cinnamic acid etc.

In this case, the shield layer is connected to the ground circuit of the conductor circuit pattern, and therefore if the insulating layer interposed between the conductor circuit pattern and the shield layer fails to perform a sufficient insulating function, the function of the printed circuit board is adversely affected. The thickness of the insulating layer as obtained with screen printing does not pose any problem, but it is important to select a proper material for the insulating layer and to form a uniform film when carrying out the screen printing.

As shown in FIG. 3, when the printed resistors disposed in the interior of the printed circuit board are surrounded in a common plane by another electro-magnetic wave shield layer 7, the influence of an electromagnetic wave on the resistors is further reduced. This shield layer can be formed by forming a copper foil into a required pattern, and it is preferred that this shield layer be formed simultaneously with the formation of the inner conductor circuits.

The present invention will now be described in further detail by way of its Example and Comparative Examples.

EXAMPLE 1 AND COMPARATIVE EXAMPLE 1

(1) Formation of inner-layer printed circuit board 50 parts by weight of phenol-formaldehyde resin (tradename: BLS-3135 manufactured by Showa Polymer K.K.), 8 parts by weight of furnace black, 32 parts by weight of talc, and 80 parts by weight of butyl Carbitol acetate were sufficiently kneaded together to prepare a paste a.

Then, a double-sided copper-clad laminate board of glass epoxy (FR-4; board thickness: 0.2 mm) (a copper foil on each side was 35 μm in thickness) was etched in the usual way to form inner shield layers 7 and conductor circuits 1 from the inner-layer copper foils, as shown in FIG. 3. At this time, the shield layer 7 was so formed as to surround resistors 4 later described. Then, a polymer thick-film silver paste (silver powder/modified phenolic resin binder; tradename: C-100 manufactured by Toa Gosei Chemical Industry Co. Ltd.) was screen-printed on terminals of the conductor circuits 1, and was dried and set to form electrodes 13 for the resistors, while ensuring an ohmic property and a contact stability.

The above-mentioned paste a was screen-printed to extend between the terminals in such a manner that the average thickness of its solids was 20±5 μm. Then, this board was placed in an oven (volume: 95l) in which nitrogen gas flowed at a rate of 20l/min., and was heated at 180° C. for 30 minutes. Then, an insulating resist (tradename S-222HR6 manufactured by Taiyo Ink K.K.) was screen-printed on each paste a, and the board was heated at 180° C. for 60 minutes. The films of the paste a were completely thermoset to provide polymer thick-film resistors 4 each bridging between the terminals.

With respect to those conductor circuits 1 having the terminals, one terminal of such conductor circuit is connected to the shield layer 7 whereas the other is connected either to the surface layer or other inner-layer circuit via a via hole 14 (to be formed at a later stage). In some cases, with respect to those conductor circuits having the terminals, both terminals of such conductor circuit are connected either to the surface layer or other inner-layer circuit via the via holes 14.

Then, if necessary, laser trimming was applied so as to adjust the resistivity between the electrodes to a set value. Then, an overcoat 5 was applied to obtain an inner-layer printed circuit board 6 of the present invention having the printed resistors mounted thereon.

(2) Formation of multi-layer printed circuit board

As shown in FIG. 1, two epoxy resin-glass cloth prepregs 3 (thickness: 0.1 mm), each containing 58 vol.% of resin, were placed on each side of the inner-layer printed circuit board 6 including the resistors 4 composed of the polymer thick film and the overcoats 5 covering these resistors. Then, a single-side copper-clad laminate board 15 having a copper foil 16 was laminated to the outer prepreg 3 on each side of the printed circuit board 6 in such a manner that the copper foil 16 constituted an outermost layer. Then, the printed circuit board 6 with the four prepregs 3 and the two laminate boards 15 was set in a vacuum thermal pressing machine, and then was subjected to an initial pressure of 5 kgf/cm² and a temperature of 120° C., and was subsequently heated to a temperature of 180° C. at a compression pressure of 35 kgf/cm², and was maintained at 180° C. for 60 minutes. Then, the printed board, while being compressed, was cooled to obtain a copper-clad laminate board having the self-contained printed resistors.

The thus obtained copper-clad laminate board having the self-contained printed resistors was drilled to form a through hole 8 (FIG. 2), and the inner surface of the through hole 8 was plated in the usual manner so as to electrically connect the via hole 14 (FIG. 3) (which was provided at the terminal portion of the conductor circuit electrically connected to the resistor 4) to the upper and lower surfaces of the printed circuit board or for connection to the inner-layer conductor circuit. Then, by a well-known pattern formation technique, a predetermined conductor circuit 17 was formed from the copper foil 16 on each surface, thereby providing a printed circuit board containing the printed resistors. In this case, a ground layer for electrically connecting a copper paste (later described) was beforehand formed on each surface of the printed circuit board.

(3) Formation of electromagnetic wave shield layer

An insulating resist (tradename: S-222HR6 manufactured by Taiyo Ink K.K.) serving as an undercoat 11 was screen-printed on each surface of the thus obtained printed circuit board over a generally entire area thereof except for those portions of the conductor circuit 17 where the ground 12, the through holes 8 and terminal portions to which chips were to be mounted by soldering were provided. Then, the undercoats 11 were set or cured in an IR furnace for 2 minutes and 30 seconds.

The multi-layer printed circuit board in this condition was adopted as Comparative Example 1 so as to confirm the effect of an electromagnetic wave shield.

Then, a copper paste 10 (tradename: NF-2000 manufactured by Tatsuta Electric Cable K.K.) for a shield layer was screen-printed to each side of the multi-layer printed circuit board over a generally entire area thereof except for the through hole portions and the chip-mounting portions, and was set or cured at 160° C. for 30 minutes. Then, a solder resist (tradename: SSR-671G manufactured by Sanei Chemical K.K.) was screen-printed to the above copper paste, and was cured at 150° C. for 30 minutes to form an overcoat 9.

Thus, a multi-layer printed circuit board having the self-contained printed resistors according to the present invention was obtained.

COMPARATIVE EXAMPLE 2 AND COMPARATIVE EXAMPLE 3

A double-sided copper-clad laminate board of glass epoxy (FR-4; board thickness: 0.2 mm) (a copper foil on each side was 35 μm in thickness) was etched in the usual way to form inner shield layers 7 and conductor circuits 1 from the inner-layer copper foils, as shown in FIG. 3.

Any printed resistor was not formed on these conductor circuits.

Two epoxy resin-glass cloth prepregs 3 (thickness 0.1 mm), each containing 58 vol.% of resin, were placed on each side of the above inner-layer printed circuit board 6. Then, a single-side copper-clad laminate board 15 having a copper foil 16 was laminated to the outer prepreg 3 on each side of the printed circuit board 6 in such a manner that the copper foil 16 constituted an outermost layer. Then, the printed circuit board 6 with the four prepregs 3 and the two laminate boards 15 was set in a vacuum thermal pressing machine, and then was subjected to an initial pressure 5 kgf/cm² and a temperature of 120° C., and was subsequently heated to a temperature of 180° C. at a compression pressure of 35 kgf/cm², and was maintained at 180° C. for 60 minutes. Then, the printed board, while being compressed, was cooled to obtain a copper-clad laminate board having the inner-layer conductor circuits.

The thus obtained copper-clad laminate board having the inner-layer conductor circuits was drilled to form through holes 8, and the inner surface of the through hole 8 was plated in the usual manner so as to electrically connect the upper and lower surfaces of the printed circuit board together or for connection to the inner-layer conductor circuit. Then, by a well-known pattern formation technique, predetermined conductor circuits 17 were formed from the copper foil 16 on each surface, thereby providing a multi-layer printed circuit board. The multi-layer printed circuit board in this condition was adopted as Comparative Example 3 so as to confirm the effect of an electromagnetic wave shield layer.

An insulating resist (tradename: S-222HR6 manufactured by Taiyo Ink K.K.) serving as an undercoat 11 was screen-printed on each surface of the thus obtained printed circuit board over a generally entire area thereof except for those portions of the conductor circuit 17 where the ground 12, the through holes 8 and terminal portions to which chips were to be mounted by soldering were provided. Then, the undercoats 11 were set or cured in an IR furnace for 2 minutes and 30 seconds. Then, a copper paste 10 (tradename: NF-2000 manufactured by Tatsuta Electric Cable K.K.) for a shield layer was screen-printed to each side of the multi-layer printed circuit board over a generally entire area thereof except for the through hole portions and the chip-mounting portions, and was set or cured at 160° C. for 30 minutes. Then, a solder resist (tradename: SSR-671G manufactured by Sanei Chemical K.K.) was screen-printed to the above copper paste, and was cured at 150° C. for 30 minutes to form an overcoat 9. Thus, an electromagnetic wave shield multi-layer printed circuit board of a conventional type was obtained (Comparative Example 2).

Necessary parts were mounted on each of the multi-layer printed circuit boards prepared in the above manner, and a VCCI class 2 information system was placed at a distance of 3 m from the multi-layer printed circuit board, and unnecessary radiation was measured at a frequency band of 100 to 200 MHz.

Discrete resistors were soldered to the surface of the printed circuit boards of Comparative Examples 2 and 3, and the comparison was made.

As a result, the amount of reduction of radiation noises obtained as compared with Comparative Example 3 (the conventional multi-layer printed circuit board) is as follows:

TABLE 1

|  | Amount of reduction of radiation noise |
|---|---|
| Example 1 | 20 to 35 dB |
| Comparative Example 1 | 5 to 10 dB |
| Comparative Example 2 | 10 to 15 dB |

As will be appreciated from the foregoing description, in the multi-layer printed circuit board of the present invention having the electromagnetic wave shield layers and the printed resistors, the resistors whose number is about ⅓ to ½ of that of the mounted parts can be included in the thin inner-layer circuits, and therefore the area required for mounting the parts can be reduced. And besides, this printed board has a high density, and is compact and lightweight, and greatly reduces the influence by unnecessary radiation, and therefore it is very useful for various kinds of electronic devices.

What is claimed is:

1. A multi-layer printed circuit board, comprising:
an insulating substrate;
a plurality of innermost conductor circuits formed on the substrate;
a plurality of printed resistors connected to and provided between respective ones of the innermost conductor circuits;
an overcoat covering the printed resistors;
a copper foil layer means that is laminated with said innermost conductor circuits;
a prepreg material laminated with said copper foil layer means and the overcoat;
a plurality of outermost conductor circuits, including a ground portion, formed on the prepreg material;
an insulating undercoat covering said outermost conductor circuits with the exception of said ground portion;
an electromagnetic wave shield layer, made of a hardened substance of copper paste, covering said undercoat and at least a part of said ground portion; and
a protective overcoat covering an outer surface of the electromagnetic wave shield layer.

2. A multi-layer printed circuit board as in claim 1, further comprising a plurality of electrodes connected to respective ends of said printed resistors, each of said electrodes being provided between respective ones of said innermost conductor circuits, said printed resistors being surrounded by said innermost conductor circuits and disposed in a common plane therewith.

3. A multi-layer printed circuit board as in claim 1, wherein said prepreg material and said copper foil layer means provide a second electromagnetic wave shield layer disposed between said plurality of innermost conductor circuits and said plurality of outermost conductor circuits and disposed at least partially in a common plane with said plurality of printed resistors.

* * * * *

UNITED STATES PATENT AND TRADEMARK OFFICE
CERTIFICATE OF CORRECTION

PATENT NO. : 5,270,493
DATED : December 14, 1993
INVENTOR(S) : INOBE et al

It is certified that error appears in the above-identified patent and that said Letters Patent is hereby corrected as shown below:

Title Page, Item [75], change "Inoue" to --Inobe--.

Signed and Sealed this

Ninth Day of August, 1994

Attest:

BRUCE LEHMAN

Attesting Officer

Commissioner of Patents and Trademarks